*(12)* United States Patent
Sengupta et al.

(10) Patent No.: US 7,763,399 B2
(45) Date of Patent: Jul. 27, 2010

(54) REMOVAL OF IONIC RESIDUES OR OXIDES AND PREVENTION OF PHOTO-INDUCED DEFECTS, IONIC CRYSTAL OR OXIDE GROWTH ON PHOTOLITHOGRAPHIC SURFACES

(75) Inventors: Archita Sengupta, San Jose, CA (US); Henry Yun, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 453 days.

(21) Appl. No.: 11/848,409

(22) Filed: Aug. 31, 2007

(65) Prior Publication Data

US 2009/0061327 A1    Mar. 5, 2009

(51) Int. Cl.
G03F 1/00 (2006.01)
B08B 3/12 (2006.01)
(52) U.S. Cl. .............................................. 430/5; 134/1
(58) Field of Classification Search ............... 134/1.1, 134/2, 1; 156/345.2, 345.3; 250/492.2, 504; 355/30; 430/5, 30, 318
See application file for complete search history.

(56) References Cited

U.S. PATENT DOCUMENTS

| | | | | |
|---|---|---|---|---|
| 5,702,849 | A * | 12/1997 | Sakata et al. | 430/5 |
| 6,071,376 | A * | 6/2000 | Nagamura et al. | 156/345.22 |
| 7,012,753 | B2 * | 3/2006 | Quesnel | 359/584 |
| 7,372,049 | B2 * | 5/2008 | Van Herpen et al. | 250/492.2 |
| 7,598,503 | B2 * | 10/2009 | Van Herpen et al. | 250/492.1 |
| 2006/0127780 | A1 * | 6/2006 | Chandhok et al. | 430/5 |
| 2006/0137717 | A1 * | 6/2006 | Lee | 134/19 |
| 2006/0165892 | A1 * | 7/2006 | Weidman | 427/248.1 |
| 2007/0146658 | A1 * | 6/2007 | Van Mierlo et al. | 355/30 |

OTHER PUBLICATIONS

Kakutani, Yukinobu et al, SPIE vol. 6517, pp. 1-11.*
Motai, Kumi et al., SPIE vol. 6517, pp. 1-8.*
Hill, S.B. et al., SPIE vol. 6517, pp. 1-12.*
Thompson, Keith C. et al., SPIE vol. 6517, pp. 1-11.*
Kakutani, Yukinobu et al., "Long-term durability of a Ru capping layer for EUVL projection optics by introducing ethanol", SPIE vol. 6517 651731, (2007), pp. 1-11.
Motai, Kumi et al., "Atomic hydrogen cleaning of Ru-capped EUV multilayer mirror", SPIE vol. 6517 65170F, (2007), pp. 1-8.
Hill, S.B. et al., "Critical parameters influencing the EUV-induced damage of Ru-capped multilayer mirrors", SPIE 6517 65170G, (2007), pp. 1-12.
Thompson, Keith C., et al., "Debris mitigation techniques for a Sn- and Xe-fueled EUV light source", SPIE vol. 6517 6513L, (2007), pp. 1-11.
Eschbach, Florence O., et al., "Removal and Prevention of Photo-Induced Defects on Photomasks Used in Photolithography", U.S. Appl. No. 11/731,264, filed Mar. 30, 2007.

* cited by examiner

*Primary Examiner*—Mark F Huff
*Assistant Examiner*—Stewart A Fraser
(74) *Attorney, Agent, or Firm*—Cool Patent, P.C.; Joseph P. Curtin

(57) ABSTRACT

Techniques associated with surface treatments for photomasks, semiconductor wafers, and/or optics are generally described. In one example, a method includes preparing a surface of a photomask or semiconductor wafer for cleaning, and removing ionic contamination from a surface of a photomask or semiconductor wafer using radical or atomic hydrogen, or suitable combinations thereof, to reduce the ionic contamination, wherein removing ionic contamination reduces the number of defects and increases semiconductor product yields accordingly.

16 Claims, 3 Drawing Sheets

REMOVAL OF IONIC RESIDUES OR OXIDES AND PREVENTION OF PHOTO-INDUCED DEFECTS, IONIC CRYSTAL OR OXIDE GROWTH ON PHOTOLITHOGRAPHIC SURFACES

TECHNICAL FIELD

Embodiments disclosed herein are generally directed to the field of semiconductor fabrication and, more particularly, to surface treatments and cleaning methods for removal of ionic residues and prevention of photo-induced defect crystal growth on photomasks and semiconductor wafers and surface treatments and cleaning methods for removal of oxides and prevention of oxide growth on optical surfaces used in photolithographic processes.

BACKGROUND

Generally, photolithographic surfaces such as surfaces of photomasks, semiconductor wafers, and optics associated with printing microelectronic features are susceptible to defect and residue formation during lithographic processes.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
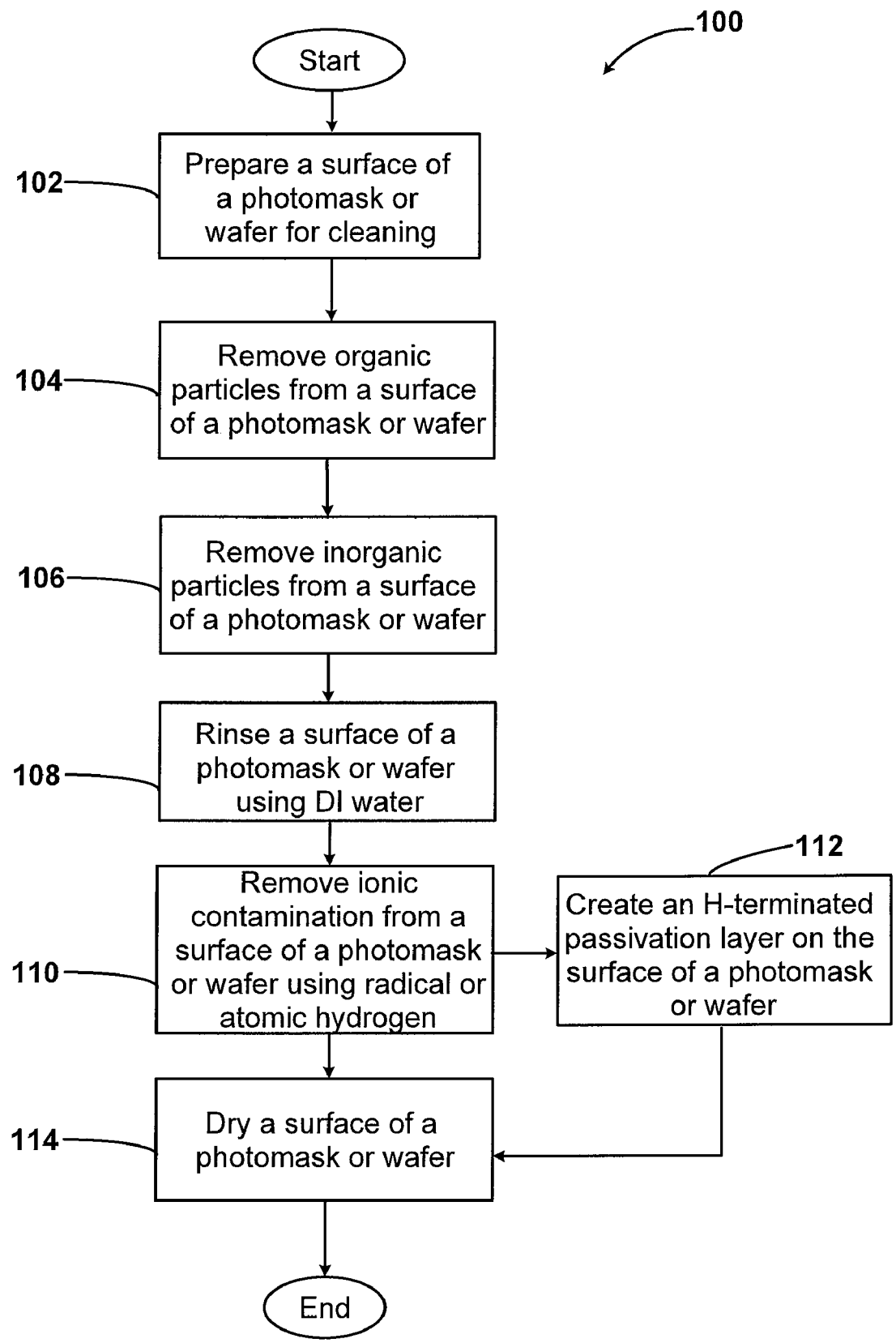
FIG. 1 is a flow diagram for cleaning a photomask or semiconductor wafer, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of removal of ionic residues or oxides and prevention of photo-induced defect crystal or oxide growth on photolithographic surfaces are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a flow diagram for cleaning a photomask 100, according to but one embodiment. In an embodiment, a method 100 comprises preparing a surface of a photomask for cleaning 102, removing organic particles from a surface of a photomask 104, removing inorganic particles from a surface of a photomask 106, rinsing a surface of a photomask using deionized (DI) water 108, removing ionic contamination from a surface of a photomask using radical or atomic hydrogen 110, creating a hydrogen-terminated passivation layer on the surface of a photomask 112, and drying a surface of a photomask 114. Drying 114 a surface may be optional. For example, a dry radical or atomic hydrogen treatment 110 may be the final action of a cleaning method 100. In an embodiment, method 100 does not require drying 114 after a dry radical or atomic hydrogen treatment. Rinsing 108 after removing ionic contamination 110 may make the surface hydrophilic and may be undesirable. In another example embodiment, drying 114 follows a wet radical or atomic hydrogen treatment 110. In yet another embodiment, drying 114 may occur after rinsing 108 and prior to removing ionic contamination 110.

Generally, photolithographic surfaces, such as surfaces of photomasks, semiconductor wafers, and optics associated with printing microelectronic features, are susceptible to defect and residue formation during lithographic processes. Such defects may include haze, crystal growth, ionic residues, and oxides among other defects. For example, sources for such defects on photomasks and wafer surfaces may stem from photochemical reactions of contaminants present near and/or on the photolithographic surfaces exposed to laser radiation, the contaminants being introduced from outgassing of pellicle, resist, storage and transport materials, environmental contaminations in the fabrication facility ("fab"), and even mask or wafer clean process-induced chemical contamination deposited on the surfaces. Photomasks impacted with progressive photoinduced defects (PID) may devastate wafer yields (i.e.,—by creating repeating bad die), reduce the lifetime of the mask due to frequent repel (i.e.,—phase loss, transmission change and/or increasing ionic residues due to excessive clean), decrease factory throughput time due to more frequent mask cleaning and inspection. Current photomask and wafer cleaning methods may also make the surfaces hydrophilic thus making the surfaces more susceptible to ionic defect formation. In another example, surfaces of extreme ultraviolet (EW) optics and photomasks form ruthenium oxide during lithographic processes.

Lithographic exposure, such as 193 nm exposure on a photomask, may generate crystal defects, which may be ionic residues, inorganic and/or organic-inorganic hybrid in nature on both front and back sides of a pelliclized photomask. Such defects on a photomask may be identified as photo-induced defects (PID). Similar defects may be formed on a semiconductor wafer surface, such as a silicon wafer, as well. A defect oxide coating may form on an EUV mask surface or optic surfaces, such as Ru-coated EUV lithography surfaces, during photolithographic processing of semiconductor devices. Embodiments disclosed herein may disclose surface treatment technologies for removing such defects or residues and/ or preventing haze or PID defect crystal growth on the front or back surfaces of pre-pelliclized and post-pelliclized optical photomasks of both optical and EUV lithography platforms or EUV photomasks and/or optic surfaces or semiconductor wafer surfaces including the front or back surfaces. In an embodiment, a reductive radical or atomic hydrogen treatment is used to clean a semiconductor wafer or photomask surface 110 of ionic residues.

Providing radical or atomic hydrogen to a surface may be accomplished by several techniques. In an embodiment, megasonic (MS) assisted hydrogenated functional water as used in a photomask or wafer clean process provides radical or atomic hydrogen for reducing ionic contaminants to removable byproducts on a photomask surface 110. In an embodiment, MS-assisted hydrogenated functional water provides surplus of radical and/or atomic hydrogen according to the following conceptual reactions, in which MS refers to megasonic sound wave energy generated by operating an external source at megahertz frequency:

$$H_2O + (MS) \rightarrow H . H .$$

$$OH . + H_2 \rightarrow H_2O + H .$$

In an embodiment, MS-assisted hydrogenated functional water is a wet process for providing radical or atomic hydrogen.

In another embodiment, hydrogen gas in the presence of activated and appropriate wavelength and energy of laser radiation provides radical hydrogen. According to an example radiation reaction:

$$H_2(g) + \text{appropriate wavelength/energy of laser radiation} \rightarrow H. \text{ formation}$$

In an embodiment, wavelengths of laser radiation used to provide radical hydrogen range from 190 to 400 nm. Hydrogen gas in the presence of laser radiation may be a dry process for providing radical and/or atomic hydrogen. In an embodiment, the reaction zone is formed at the mask, wafer, or optic surface 110. In another embodiment, a laser-assisted hydrogen-plasma reaction provides radical hydrogen. In an embodiment, removing ionic contamination 110 is accomplished by using MS-assisted hydrogenated functional water, hydrogen gas in the presence of activated laser radiation, or a laser-assisted hydrogen-plasma reaction to provide radical hydrogen. Other methods of providing radical hydrogen may also fall within the scope of this description.

Cleaning techniques disclosed herein may apply to a variety of photomasks. In an embodiment, using radical hydrogen to remove contamination from a surface of a photomask 110 includes optical and EUV masks, including binary, phase-shifting, attenuated phase-shifting, pelliclized, or unpelliclized masks. In an embodiment, optical masks include 193 nm, 248 nm, and/or 365 nm masks. Masks used in immersion technologies are included in this description as well. In an embodiment, EUV masks include Ru-capped MoSi multi-layer blank embodiments among others. Treatments may be applied to the front or back surface of a photomask. The surfaces of optical photomasks may typically include materials, such as quartz and chrome oxide and/or chrome oxinitride or molybdenum silicide and chrome oxide and/or chrome oxinitride, but may include others. The surfaces of EUV masks may typically include Ru-capped MoSi multi-layer and low-thermal-expansion material (LTEM), among others.

As described above, removing ionic contamination using radical hydrogen 110 may be enabled by wet (MS assisted) or dry (laser assisted) conditions among other conditions which may also provide radical or atomic hydrogen to apply on a surface as described above, under controlled temperature. In an embodiment, the wet technique is used for pre-pelliclized mask clean and/or for cleaning of quartz or glass side of a pelliclized mask and/or wafer cleaning and/or EUV mask surface cleaning. In an embodiment, the dry technique is used for both pre-pelliclized and post-pelliclized mask cleaning, wafer cleaning, and/or periodic surface treatment for passivation improvement and as preventative measure to stop ionic absorption or adsorption on the mask or wafer surface or optics surface. In an embodiment, radical or atomic hydrogen 110, 112 may be used as a surface treatment for preparing a mask for first use and later for periodic cleaning. Such use may extend a mask usage lifetime before the mask develops significant PID or haze crystal growth, leading to higher wafer yields and higher throughput time due to less maintenance, inspection, and cleaning.

Ionic defects and/or PID may stem from photochemical reactions of contaminants by laser radiation, the contaminants being introduced from a variety of sources such as outgassing of pellicle, resist, mask or wafer storage and transport materials, environmental contaminations in the photomask and/or wafer fabrication facility ("fab"), and even photomask-clean-process-induced chemical contamination deposited on the mask surface. In an embodiment, ionic contamination or defects or PID includes compounds formed from acidic components including sulfate ions, organic acids, or other acidic ions and alkaline components including ammonium ions, organic alkalis, or amines. In another embodiment, ionic contamination includes ammonium sulfate, ammonium sulfite, ammonium formate, ammonium acetate, ammonium oxalate, ammonium carbonate, ammonium carbamate, and/or ammonium bicarbonate. Ionic contamination may be removed from a surface of a photomask or semiconductor wafer using radical or atomic hydrogen 110. Radical and/or atomic hydrogen may undergo a reductive chemistry with ionic contaminants to produce removable byproducts, e.g., gaseous byproducts as in the general example below. An exemplary embodiment follows for reducing ammonium and sulfate ions using radical hydrogen:

$$H. + NH_4^+ \rightarrow \text{Contact radical ion pair} + NH_3(g) + H_2(g)$$

$$SO_4^{2-} + 4H_2 \rightarrow S^{2-} + 4H_2O (S^{2-} \text{ may be removed as } H_2S \text{ gas})$$

In another embodiment, ammonium sulfate is reduced to $H_2S$, and $NH_3$, among other byproducts, for removal from a photomask or wafer surface 110. Other ionic compounds may undergo similar reductive reactions to facilitate removal from a photomask or wafer surface 110. This radical and/or atomic hydrogen can passivate the mask surface, such as quartz surface or a hydrophilic wafer surface by replacing the dangling Si—OH bonds with H-terminated Si and thus change the mask surface hydrophilicity (which may be hydrophilic as a result of standard wet clean processes) to more hydrophobic in nature, thus repelling further ionic species from absorbing or adsorbing onto the surface.

In an embodiment, removing ionic contamination from a surface of a photomask using radical or atomic hydrogen 110 occurs after a typical wet mask clean process using standard chemistry 102, 104, 106. Preparing a surface of a photomask for cleaning 102 may include a dry preparation including exposure to UV radiation and/or ozone to oxidize surface hydrocarbons, metals, or other reactive contaminants, and/or to activate adsorbed ions to form seeds for future crystal growth. Such treatment may also make the surface hydrophilic and thus more adsorbing towards ionic contaminants. Removing organic particles from a surface of a photomask 104 may include a wet treatment including sulfuric acid and/or hydrogen peroxide mixture to oxidize surface hydrocarbons, metals, or other reactive contaminants for removal. Removing organic and/or inorganic 104, 106 particles from a surface may include a treatment with ammonium hydroxide and/or hydrogen peroxide mixture, which may facilitate the formation of ionic residues on the mask surface, which may be removed by the reductive process described above 110, 112.

Treating with ammonium hydroxide 104, 106 may produce hydroxyl-terminated bonds at the surface of a photomask material, the hydroxyl-terminated bonds providing a relatively hydrophilic surface when compared to a surface with hydrogen-terminated bonds. A less hydrophilic surface may be desirable to reduce the amount of ionic contamination adsorbed or absorbed on the surface of a photomask. In an embodiment, radical hydrogen is used to create a hydrogen-terminated passivation layer on the surface of a photomask or semiconductor wafer such as silicon 112, making the surface more hydrophobic than a surface with hydroxyl-terminated bonds. In an embodiment, a hydrogen-terminated passivation layer 112 is created simultaneously with the removal of ionic contamination from a surface of a photomask using radical hydrogen 110. In an embodiment, a method 100 includes creating a hydrogen-terminated passivation layer on the surface of a photomask or semiconductor wafer 112 using radical hydrogen to alter the surface chemistry and render the surface more hydrophobic.

Figure 2:
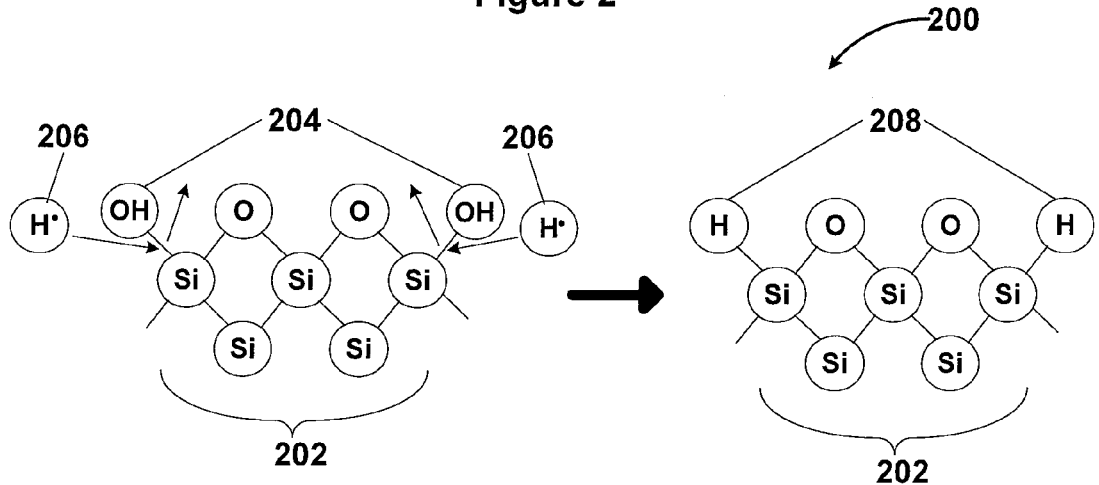
FIG. 2 is a schematic depicting replacement of surface hydroxyl groups with hydrogen, according to but one embodiment.

FIG. 2 is a schematic depicting replacement of surface hydroxyl groups with hydrogen 200, according to but one embodiment. In an embodiment, a surface includes quartz ($SiO_2$) 202 coupled with dangling bond hydroxyl groups 204. In an embodiment, radical hydrogen 206 is introduced to a surface 202, 204 to replace the dangling hydroxyl groups 204 with hydrogen-terminated bonds 208. Replacing hydroxyl 204 groups with hydrogen 208 may render a photomask surface more hydrophobic making it less susceptible to ionic contamination.

A hydrophilic quartz surface 202, 204 may be more favorable to crystal growth due to the ionic nature of the PID defect formation and interaction. The surface may be more hydrophilic due to hydroxyl-terminated 204 bonds that may result from prior wet clean processes. In an embodiment, radical hydrogen 206 is introduced to a surface 202, 204 after prior wet clean processes have introduced hydroxyl groups 204 to the surface.

In an embodiment, introducing radical hydrogen 206 to a photomask surface 202, 204 creates a hydrogen-terminated 208 passivation layer that is more hydrophobic in nature, thereby repelling ionic crystal deposition and growth on the surface. Creating a passivation layer may occur simultaneously with introducing radical hydrogen to remove ionic contamination from a surface of a photomask.

In an embodiment, introducing radical hydrogen 206 to a photomask surface includes photomasks made of materials other than quartz as depicted in FIG. 2. For example, in other embodiments, other optical photomask surfaces and EUV photomasks may include other materials, but may have similar benefit from passivation with H-terminated bonds by rendering the surface hydrophobic and thus passivating the surface against the photoinduced and/or ionic defect formation. In an embodiment, surface 202 includes another material, such as low-thermal-expansion material (LTEM). Such embodiments fall within the scope of this disclosure.

Figure 3:
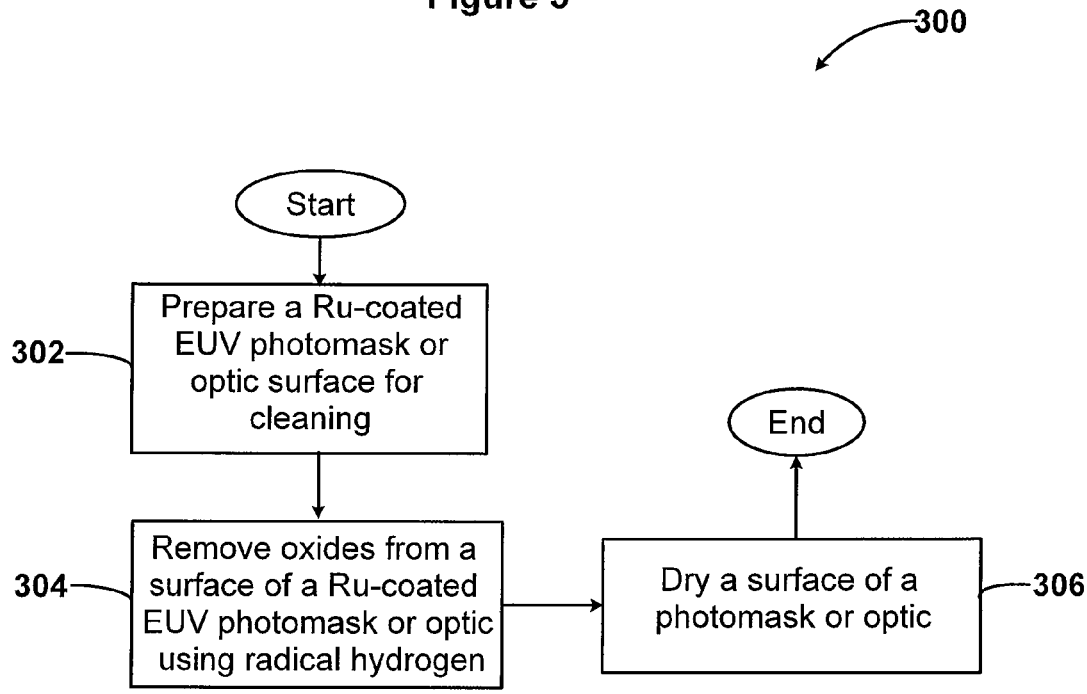
FIG. 3 is a flow diagram for cleaning a Ru-coated EUV photomask or optic surface, according to but one embodiment.

FIG. 3 is a flow diagram for cleaning a Ru-coated EUV photomask or optics surfaces 300, according to but one embodiment. In an embodiment, a method 300 includes preparing a Ru-coated EUV photomask or optics surfaces for cleaning 302, removing oxide and/or oxides from a surface of a Ru-coated EUV photomask or optics using radical and/or atomic hydrogen 304, and drying a surface of a photomask or optic 306. In an embodiment, drying 306 is not necessary for a dry radical hydrogen reduction process 304 of an optic.

Ruthenium oxide is easily formed from metallic Ruthenium-coated surfaces of EUV optics, for example, mirrors or lenses, and/or photomasks exposed to various oxidizing cleaning chemistry, such as ozone chemistry or sulfuric acid and hydrogen peroxide treatment, air or other oxygen-containing ambient under radiation used for EUV lithography processing. Ruthenium oxide may lower the reflectivity of the mask surface and/or optics. In an embodiment, RuO assumes a variety of oxidation states including the most common oxidation states, in which Ru is +2, +3, or +4 oxidation state. In an embodiment, $Ru_xO_y$ is formed on the surface of an EUV photomask or optical surface, in which x and y are integers that provide suitable stoichiometric quantities according to oxidation states. In an embodiment, x is 1 and y is 1, 2 or 4. According to an embodiment, radical and/or atomic hydrogen reduces ruthenium oxide back to metallic ruthenium 304. In other embodiments, EUV optics coated with analogous metals to Ru are cleaned using radical hydrogen to remove metallic oxides by reducing them back to metallic state. A benefit of this type of restoration process of an EUV Ru-coated surface with radical hydrogen is a lower temperature, less costly alternative to remote plasma cleaning methods.

In an embodiment, an EUV photomask includes an Ru-capped multilayer blank. In another embodiment, an EUV optical material includes mirrors that direct EUV radiation from a source to a printed product. In another embodiment, suitable embodiments already described for FIGS. 1-2 are incorporated in embodiments described for FIG. 3.

Figure 4:
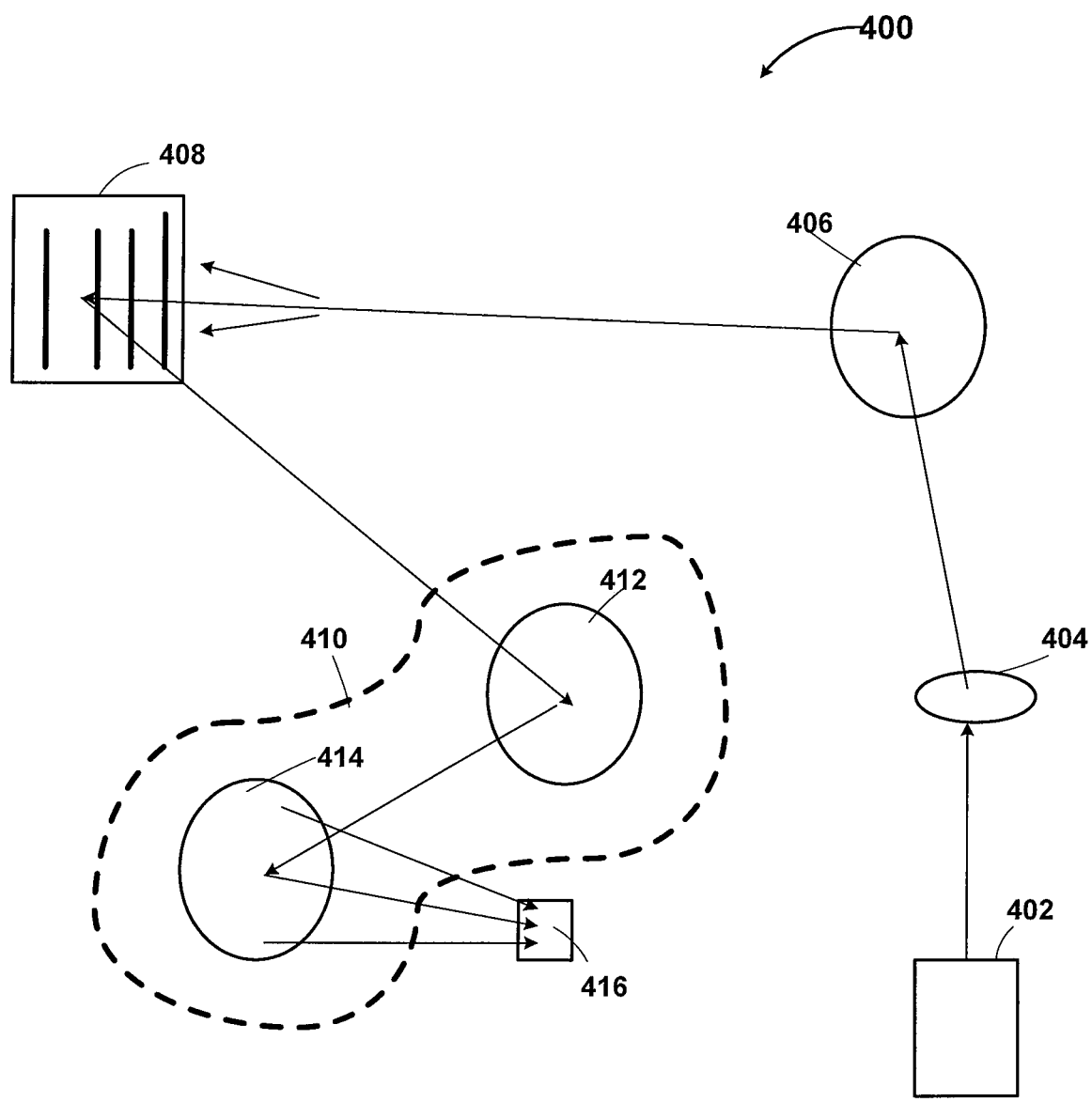
FIG. 4 is a diagram of an example system in which embodiments of the present invention may be used, according to but one embodiment.

FIG. 4 is a diagram of an example system in which embodiments of the present invention may be used 400, according to but one embodiment. In an embodiment, system 400 is an EUV lithography system comprising laser 402, plasma 404, optical condenser 406, photomask 408, reduction optics 410, and semiconductor substrate 416, each coupled as shown. In an embodiment, system 400 is an EUV stepper or scanner. Arrows may suggest a radiation pathway through the system 400. Although an EUV lithography system 400 is shown here as an example, embodiments disclosed herein may apply to other lithography platforms as already described including 193 nm, 248 nm, and 365 nm optical lithography, for example.

In an embodiment, a laser 402 generates a laser beam to bombard a target material, which produces plasma 404 with significant broadband extreme ultra-violet (EW) radiation. An optical condenser 406 may collect the EUV radiation through mirrors coated with EUV interference films, such as Ru. The optical condenser 406 may illuminate a reflective mask 408 with EUV radiation of about 13 nm wavelength. In an embodiment, a reflective mask 408 is a photomask that is cleaned and restored to original metallic state according to embodiments described herein. In an embodiment, EUV optics 406 and 410 are cleaned according to embodiments already described herein. Mask 408 may have an absorber pattern across its surface, which may comprise one or more integrated circuit designs. The pattern may be typically imaged at 4:1 demagnification by the reduction optics 410. The reduction optics 410 may include mirrors, such as mirrors 412 and 414. These mirrors, for example, may be aspherical with tight surface figures and roughness (e.g., less than 3 Ångstroms).

In an embodiment, a semiconductor substrate 416 is coated with resist that is sensitive to EUV radiation. The semiconductor substrate 416 may be a silicon-based wafer. The resist may be imaged with the pattern on the reflective mask 408. Typically, a step-and-scan exposure may be performed, i.e., the photomask 408 and the substrate 416 are synchronously scanned. Using this technique, a resolution less than 50 nm may be possible. The dimensions may not be scaled in the illustrative figure. Disclosed cleaning and passivating surface treatments for photomask 408, semiconductor surface 416, and optics 406, 410 may increase the quality of a printed product 416 by reducing ionic and oxidative defects that marginalize printing quality.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. A method, comprising:
   preparing a Ru-coated extreme ultraviolet (EUV) lithographic surface for cleaning; and
   removing oxide from the Ru-coated EUV lithographic surface using radical hydrogen to reduce $Ru_xO_y$ to Ru, in which x and y are integers that provide suitable stoichiometric quantities, wherein removing oxide contamination using the radical hydrogen creates a hydrogen-terminated passivation layer of the EUV lithographic surface.

2. A method according to claim 1, wherein removing oxide from a Ru-coated EUV surface using radical hydrogen comprises reducing $Ru_xO_y$ to Ru, in which x is 1 and y is 1, 2 or 4.

3. A method according to claim 2, wherein creating a hydrogen-terminated passivation layer renders the surface of the EUV photomask more hydrophobic to reduce photoinduced defect formation.

4. A method according to claim 3, wherein the EUV surface is the surface of a Ru-coated EUV optic.

5. A method according to claim 3, wherein the EUV surface is the surface of a Ru-coated EUV photomask.

6. A method according to claim 2, wherein creating a hydrogen-terminated passivation layer renders the surface of the EUV photomask more hydrophobic to reduce ionic species absorption or adsorption on the surface.

7. A method according to claim 6, wherein the EUV surface is the surface of a Ru-coated EUV optic.

8. A method according to claim 6, wherein the EUV surface is the surface of a Ru-coated EUV photomask.

9. A method, comprising:
   preparing a surface of an extreme ultraviolet (EUV) photomask for cleaning; and
   removing ionic contamination from a surface of the EUV photomask using radical hydrogen to reduce the ionic contamination of the EUV photomask, wherein removing ionic contamination using the radical hydrogen creates a hydrogen-terminated passivation layer of the surface of the EUV photomask.

10. A method according to claim 9, further comprising:
    removing organic particles from a surface of the EUV photomask;
    removing inorganic particles from a surface of the EUV photomask;
    rinsing a surface of the EUV photomask; and
    drying a surface of the EUV photomask.

11. A method according to claim 10, wherein the EUV photomask comprises dry 193 nm, immersion 193 nm, 248 nm, or 365 nm optical EUV photomasks, binary, phase-shifting, pelliclized, or unpelliclized, or suitable combinations thereof.

12. A method according to claim 11, wherein the ionic contamination comprises ammonium sulfate, ammonium sulfite, ammonium formate, ammonium acetate, ammonium oxalate, ammonium carbonate, ammonium carbamate, ammonium bicarbonate, or combinations thereof, or an ionic compound formed from acids comprising sulfate ions, organic acids, or acidic ions and alkalis comprising ammonium ions, organic alkalis, or amines, or hybrid contamination comprising part organic and part inorganic composition.

13. A method according to claim 12, wherein the surface is a front or back side of the EUV photomask, the surface comprising quartz, chromium oxide, chromium oxinitride, molybdenum silicide, low-thermal-expansion material (LTEM), or Ru-capped multilayer, or Ru-coated optical material, or combinations thereof.

14. A method according to claim 13, wherein removing ionic contamination is further accomplished by using megasonic assisted hydrogenated functional water, hydrogen gas in the presence of activated laser radiation, or a laser-assisted hydrogen plasma reaction to provide radical hydrogen.

15. A method according to claim 14,
    wherein creating a hydrogen-terminated passivation layer renders the surface of the EUV photomask more hydrophobic to reduce photoinduced defect formation.

16. A method according to claim 14,
    wherein creating a hydrogen-terminated passivation layer renders the surface of the EUV photomask more hydrophobic to reduce ionic species absorption or adsorption on the surface.

* * * * *